United States Patent
Wang et al.

(10) Patent No.: US 8,953,405 B2
(45) Date of Patent: Feb. 10, 2015

(54) SWITCHING CIRCUIT

(71) Applicant: Taiwan Semiconductor Manufacturing Company, Ltd., Hsinchu (TW)

(72) Inventors: Bing Wang, Palo Alto, CA (US); Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 167 days.

(21) Appl. No.: 13/765,475

(22) Filed: Feb. 12, 2013

(65) Prior Publication Data

US 2013/0286761 A1    Oct. 31, 2013

Related U.S. Application Data

(60) Provisional application No. 61/640,509, filed on Apr. 30, 2012.

(51) Int. Cl.
| | |
|---|---|
| *G11C 7/00* | (2006.01) |
| *G11C 5/14* | (2006.01) |
| *G11C 5/02* | (2006.01) |

(52) U.S. Cl.
CPC ........ *G11C 5/14* (2013.01); *G11C 5/025* (2013.01); *G11C 5/148* (2013.01)
USPC .......................................................... 365/226

(58) Field of Classification Search
USPC ................. 365/226, 194, 63, 189.11
See application file for complete search history.

(56) References Cited

U.S. PATENT DOCUMENTS 7,123,536 B2 * 10/2006 Kang .......................... 365/226

* cited by examiner

*Primary Examiner* — David Lam
(74) *Attorney, Agent, or Firm* — Lowe Hauptman & Ham, LLP

(57) ABSTRACT

A first transistor is turned on based on a first control signal provided to a first terminal of the first transistor. A second transistor is turned on based on a second control signal delayed by a time delay from the first control signal. A second terminal of the first transistor is coupled with a second terminal of the second transistor. The second control signal is used to control a first input signal of a logic device. The logic device receives a second input signal inversed from the first control signal. An output signal of the logic device is used to control a first terminal of the second transistor.

20 Claims, 11 Drawing Sheets

| | SLPb | SLPb_dly | N1 | N2 | SLP | F | A | B | C | Cb | D | E | 230 |
|---|---|---|---|---|---|---|---|---|---|---|---|---|---|
| 410 Normal R/W | 1 | 1 | on | on | 0 | 0 | 0 | 1 | 0 | x | 0 | 1 | off |
| 420 Sleep mode (low VDD) | 0 | 0 | off | off | 1 | 1 | 1 | 1 | 0 | 1 | 0 | 0 | on |
| 430 Sleep mode (high VDD) | 0 | 0 | off | off | 1 | 1 | 1 | 0 | 1 | 0 | 1 | 0 | on |
| 440 Wake up to normal mode (low VDD) | 1 | 1 | on | on | 0 | 0 | 0 | 1 | 0 | 1 | 0 | 1 | off |
| 450 Wake up to normal mode (high VDD), before time delay T210 has elapsed | 1 | 0 | on | off | 0 | 0 | 0 | 1 | 0 | 0 | 1 | 0 | off |

FIG. 4

| | PSLP | SLP_dly | MP1 | MP2 | PSLPb | PF | PA | PB | PC | PCb | PD | PE | 530 |
|---|---|---|---|---|---|---|---|---|---|---|---|---|---|
| 710 Normal R/W | 0 | 0 | on | on | 1 | 1 | 1 | 0 | 1 | x | 1 | 0 | off |
| 720 Sleep mode (low VDD) | 1 | 1 | off | off | 0 | 0 | 0 | 0 | 1 | 0 | 1 | 1 | on |
| 730 Sleep mode (high VDD) | 1 | 1 | off | off | 0 | 0 | 0 | 1 | 0 | 1 | 0 | 1 | on |
| 740 Wake up to normal mode (low VDD) | 0 | 0 | on | on | 1 | 1 | 1 | 0 | 1 | 0 | 1 | 0 | off |
| 750 Wake up to normal mode (high VDD), before time delay T510 has elapsed | 0 | 1 | on | off | 1 | 1 | 1 | 0 | 1 | 1 | 0 | 1 | off |

FIG. 7

SWITCHING CIRCUIT

CROSS-REFERENCE TO RELATED APPLICATION

The present application claims priority of U.S. Provisional Patent Application No. 61/640,509, filed on Apr. 30, 2012, which is incorporated herein by reference in its entirety.

FIELD

The present disclosure is related to a switching circuit.

BACKGROUND

Some transistors in integrated circuits are typical transistors. Some transistors switch slower than the typical transistors, and are called transistors in the slow corner. Some transistors switch faster than the typical transistors, and are called transistors in the fast corner.

In a memory array, various power switches or transistors are placed at input-output (IO) circuits and at decoder circuits in the row or X direction of the memory array. During a wake up time of the memory array, particularly at high operational voltage values and/or when the transistors are in the fast corner, many transistors are turned on all together in a short period of time, which causes a large wake up current.

BRIEF DESCRIPTION OF THE DRAWINGS

The details of one or more embodiments of the disclosure are set forth in the accompanying drawings and the description below. Other features and advantages will be apparent from the description, drawings, and claims.

FIG. 4 is a table of operations of the circuit in FIG. 2B, in accordance with some embodiments.

FIG. 7 is a table of operations of the circuit in FIG. 5B, in accordance with some embodiments.

Like reference symbols in the various drawings indicate like elements.

DETAILED DESCRIPTION

Figure 1:
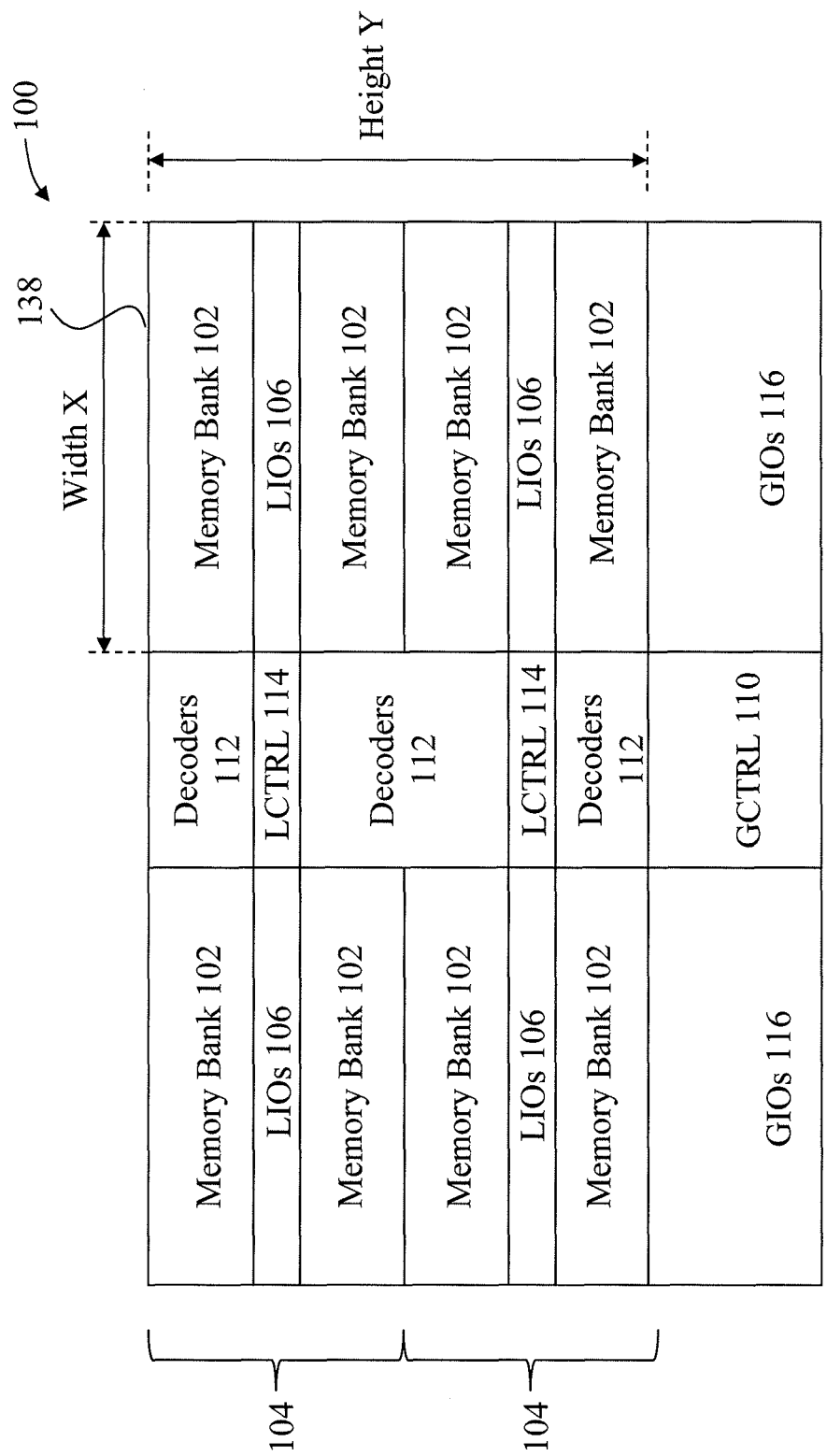
FIG. 1 is a diagram of a memory macro, in accordance with some embodiments.

Embodiments, or examples, illustrated in the drawings are disclosed below using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Some embodiments have at least one of the following features and/or advantages. A wake up surge current is controlled at high operational voltage values and fast process corners, while satisfying a short wake up specification at low operational voltage values and slow process corners. In some embodiments, when the operational voltage value is high, a first transistor is turned on first to provide enough current to wake up corresponding circuits. A second transistor is turned on after a predetermined time delay. The first and the second transistors serve as a current path for the corresponding circuits. As a result, the surge current at wake up is controlled to an acceptable value. When the operational voltage value is low, the first transistor and the second transistor are turned on at about the same time.

Memory Macro

FIG. 1 is a block diagram of a static random access memory (SRAM) macro 100, in accordance with some embodiments. SRAM is used for illustration. Other types of memories are within the scope of various embodiments.

Memory macro 100 is symmetrical. For example, with reference to decoders 112, local control circuits (LCTRLs) 114, and global control circuit (GCTRL) 110, circuit elements on the left side are similar to circuit elements on the right side of memory macro 100. For another example, memory macro 100 includes two memory arrays, one on the left side and one on the right side. For illustration, one memory array on the right side is labeled as a memory array 138 that has a width X and a height Y.

Memory macro 100 includes a plurality of memory segments 104. Two memory segments 104 are shown for illustration. A different number of memory segments 104 is within the scope of various embodiments. Each segment 104 includes four memory banks 102, two memory banks on the left and two memory banks on the right. On each left and right side of memory macro 100, two memory banks 102 share a row of a plurality of local input-output circuits (LIOs) 106. Memory cells in a memory bank 102 are arranged in rows and columns. As a result, memory cells in a memory segment 104 and in a memory array 138 are also arranged in rows and columns. Different configurations of a memory segment 104 are within the scope of various embodiments.

X-address decoders 112, labeled as decoders 112, provide addresses of memory cells to be accessed for a read or a write operation in the X or row direction. Local control circuits (LCTRLs) 114 control LIOs 106. Global input-output circuits (GIO) 116 serve to transfer data between memory cells and circuits outside of memory macro 100. A global control circuit (GCTRL) 110 provides the address pre-decode, clock, and other signals for memory macro 100. GCTRL 110 also controls the data transfer between memory cells and circuits outside of memory macro 100.

Exemplary Circuits with Footers

Figure 2A:
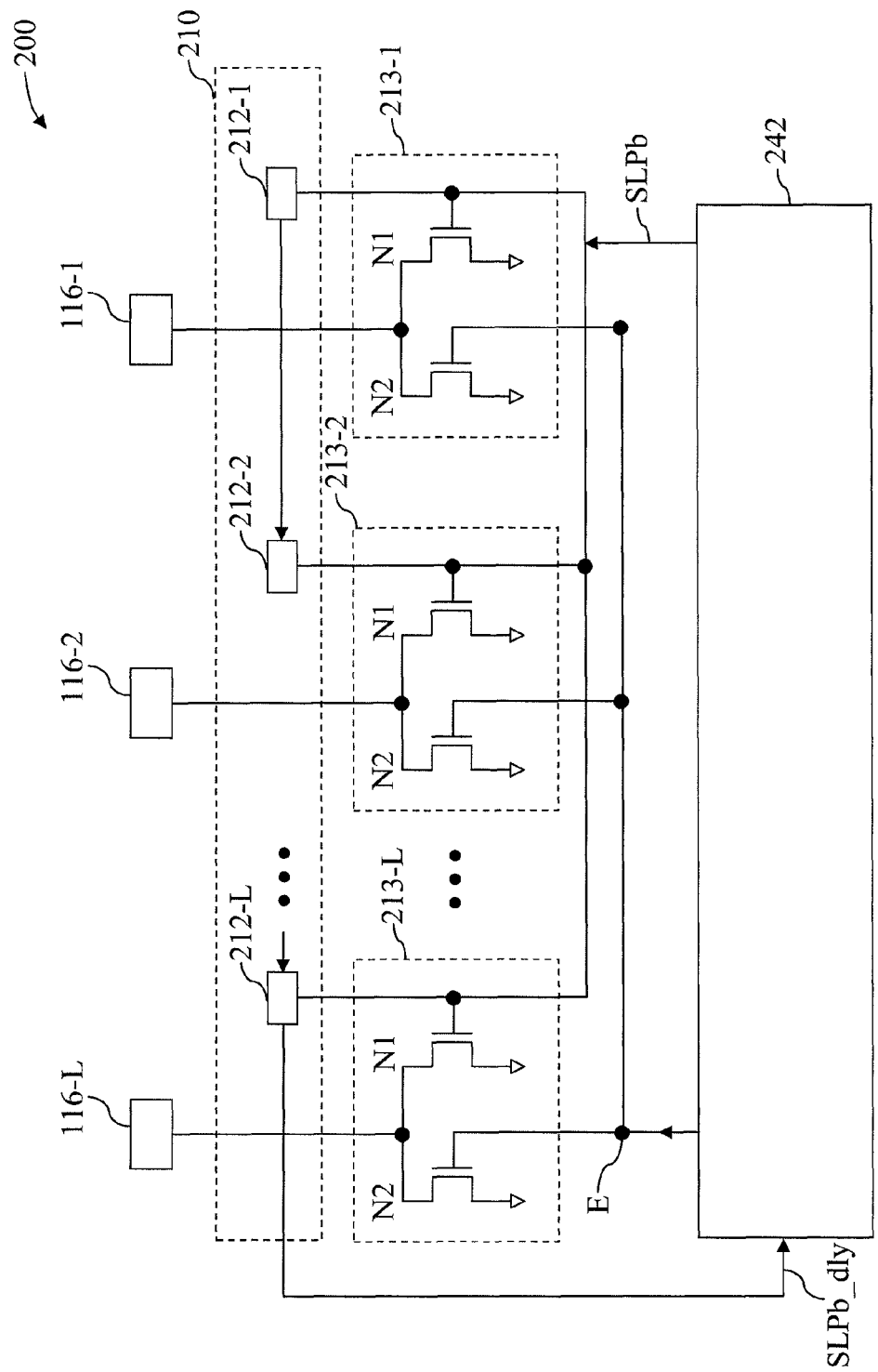
FIG. 2A is a diagram of a circuit illustrating connections of various circuits and corresponding footer circuits of the memory macro in FIG. 1, in accordance with some embodiments.

FIG. 2A is a diagram of a circuit 200, in accordance with some embodiments. Circuit 200 is used to illustrate connection of GIOs 116 in FIG. 1 with corresponding footer circuits 213.

Each footer circuit or footer 213-1 to 213-L corresponds to a GIO 116. For illustration, L number of GIOs 116 from GIO 116-1 to GIO 116-L are shown. Similarly, L number of corresponding footers 213-1 to 213-L are shown. A footer 213 serves as a current path for the corresponding GIO 116. Each footer 213 includes a pair of N-type metal-oxide-semiconductor (NMOS) transistors N1 and N2. In some embodiments, during the wake up time of memory macro 100 and thus GIOs 116, transistors N1 and N2 are turned on at different times or at the same time depending on the voltage value of operational voltage VDD. For example, when operational voltage value VDD is high, transistor N1 is turned on first, and transistor N2 is turned on after a predetermined time delay. In contrast, when operational voltage value VDD is low, both transistors N1 and N2 are turned on at about the same time. In some embodiments, footers 213 are called current circuits because footers 213 serve as current paths for GIOs 116. Footers 213 are also called switching circuits because transistors N1 and N2 in a footer 213 are switched on and off to turn GIO 116 on and off, respectively.

A delay circuit 210 receives a control signal SLPb from a control circuit 242 and generates a control signal SLPb_dly delayed from control signal SLPb by a time delay T210 (not labeled). In some embodiments, delay circuit 210 includes a plurality of delay elements 212-1 to 212-L. Each delay element 212 corresponds to a GIO 116 and a footer 213. Control signals SLPb and SLPb_dly are used to turn on transistors N1 and N2 of footer 213 at different times.

Control circuit 242 provides control signal SLPb to delay circuit 210 and to gates of transistors N1 of footer circuits 213. Control circuit 242 also receives control signal SLPb_dly, and based on control signal SLPb_dly, generates a control signal on node E that is received by gates of transistors N2 of footers 213. Because the control signal on node E controls transistors N2, effectively, transistors N2 of footers 213 are controlled by control signal SLPb_dly. In some embodiments, control circuit 242 is used with a row of GIOs 116 of memory macro 100. In other words, a row of GIOs 116 includes L GIOs 116 in both the left side and the right side of memory macro 100. GIOs 116 are used for illustration. In some embodiments, a decoder 112 is used in place of GIO 116, and another control circuit similar to control circuit 242 is used with a column of decoders 112. In some embodiments, control circuit 242 is part of GCTRL 110 in FIG. 1.

Figure 2B:
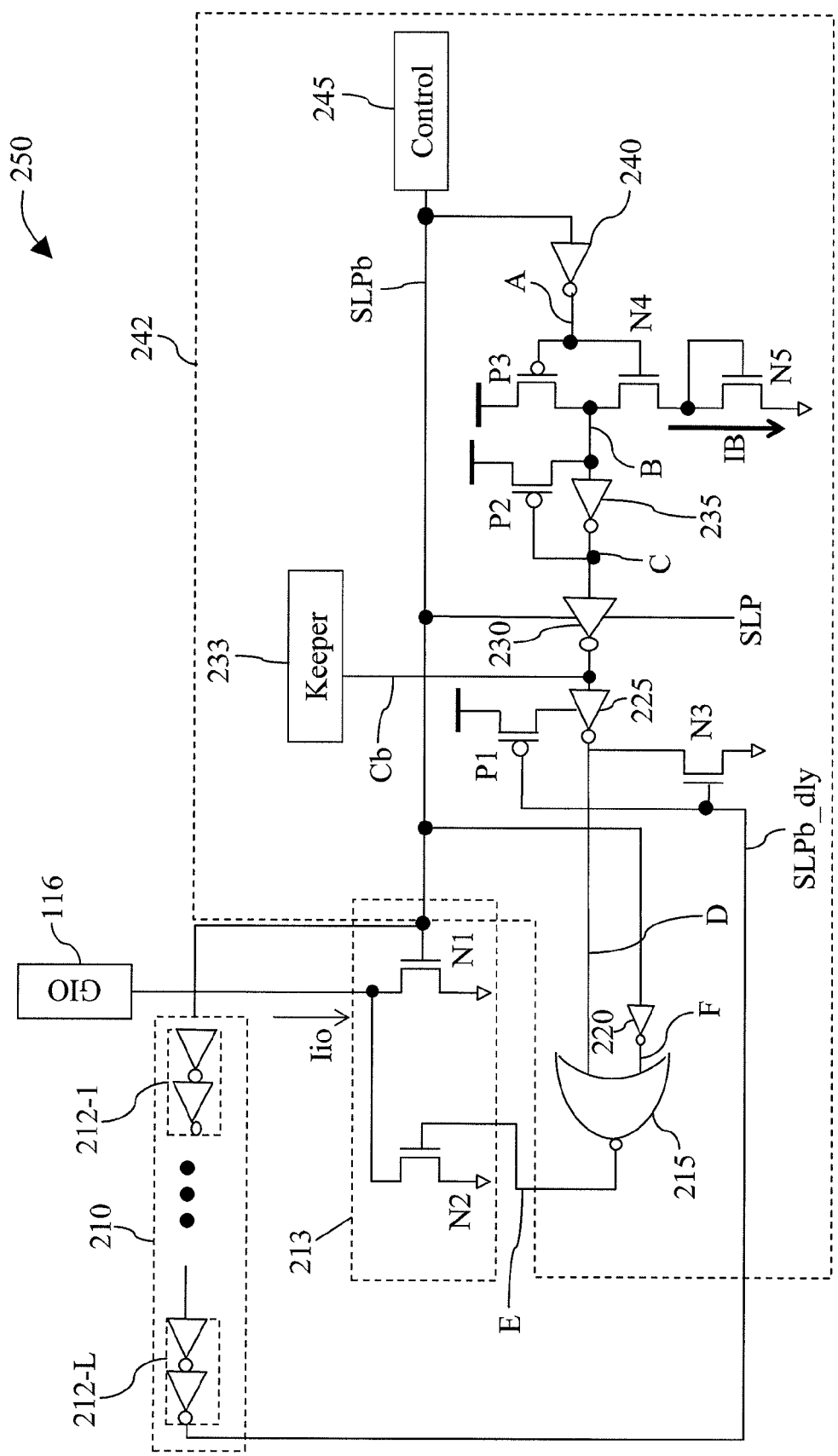
FIG. 2B is a diagram of a circuit illustrating connections of a global input-output circuit, a delay circuit, a footer circuit, and a control circuit of the circuit in FIG. 2A, in accordance with some embodiments.

FIG. 2B is a diagram of a circuit 250, in accordance with some embodiments. Circuit 250 is used to illustrate an operation of GIO 116, footer 213, delay circuit 210, and control circuit 242.

NMOS transistors N1 and N2 in footer 213 serve as current paths for GIO 116. Effectively, transistors N1 and N2 turn on or turn off GIO 116. For example, when both transistors N1 and N2 are turned off, footer 213 functions as an open circuit, and is electrically disconnected from GIO 116. But when both transistors N1 and N2 are completely turned on, both transistors N1 and N2 function as current paths for a current Iio to flow through the drains and the sources of transistors N2 and N1. In some embodiments, the sources of both transistors N1 and N2 receive a reference voltage VSS, which, in some embodiments is ground. Effectively, current Iio flows from GIO 116 through transistors N1 and N2 to ground.

In some embodiments, when memory macro 100 is in the wake up mode, if operational voltage VDD is above a predetermined voltage value that is considered a high operating voltage condition, transistor N1 is turned on first. Transistor N2 is then turned on after a predetermined period of time T210, which will be explained below. But when the value for operating voltage value VDD is below the predetermined voltage value that is considered a low operating voltage condition, both transistors N1 and N2 are turned on at about the same time. In some embodiments, a high operating voltage value of operational voltage VDD is about 110% of a nominal value of operating voltage VDD while a low value of operational voltage VDD is about 90% of the nominal value of operating voltage VDD, and the nominal value of operating voltage VDD is 0.9 V.

For illustration, current Iio in the high operating voltage value VDD is called Iioh (not labeled) while current Iio in the low operating voltage value is called current Iiol (not labeled). In some embodiments, transistors N1 and N2 are sized such that a current ratio Irat (not labeled) is about ⅓. Mathematically, Irat=Iiol/Iioh=⅓.

Delay circuit 210 generates time delay T210 that delays signal SLPb at the output of control circuit 242 or at the gate of transistor N1. For example, signal SLPb_dly at gates of an NMOS transistor N3 and a p-type metal-oxide-semiconductor (PMOS) transistor P1 is signal SLPb at the gate of transistor N1 delayed by time delay T210. Signal SLPb_dly is then used to turn on and off NMOS transistor N3 and PMOS transistor P1, which determines a logical value of a signal on node D. The control signal on node E is affected by the signal on node D, and is used to turn on and off transistor N2. Effectively, transistor N2 is turned on and off based on control signal SLPb_dly. In some embodiments, time delay T210 is selected such that transistor N2 of footer circuit 213 that is farthest from a sub-control circuit 245, is turned on after time delay T210. An example of the farthest circuit is circuit 213-L in FIG. 2A. As a result, in some embodiments, by the time time delay T210 has passed from the start of signal SLPb at the output of control circuit 245, transistors N2 in a row are ready to be turned on, and generate a surge current in an acceptable range.

In some embodiments, a delay element 212 of delay circuit 210 includes a pair of inverters. In other words, an inverter pair 212 corresponds to GIO 116 in FIG. 2A. Circuit 210 is shown with a plurality of inverter pairs 212 is for illustration. Other circuits providing a time delay T210 are within the scope of various embodiments.

A logic circuit in the form of a NOR gate 215 provides a signal at the output of NOR gate 215 at node E or at the gate of transistor N2 to turn on or off transistor N2. For example, when both signals on nodes D and F at the inputs of NOR gate 215 are logically low, a signal on node E is logically high, which turns on NMOS transistor N2.

An inverter 220 inverts signal SLPb to generate a signal on node F at an input of NOR gate 215.

Gates of PMOS transistor P1 and NMOS transistor N3 are coupled together and are configured to receive signal SLPb_dly. When signal SLPb_dly is logically low, PMOS transistor P1 is turned on while NMOS transistor N3 is turned off. But when signal SLPb_dly is logically high, PMOS P1 transistor is turned off while NMOS transistor N3 is turned on. PMOS transistor P1 is used to control inverter 225. For example, when signal SLPb_dly at a gate of transistor P1 is logically low, transistor P1 is turned on, which, in turns, turns on inverter 225. In such a situation, the signal on node D is an inverse of a signal on node Cb at the input of inverter 225. Effectively, PMOS transistor P1 controls the signal on node D. In contrast, when signal SLPb_dly is logically high, transistor P1 is turned off, which also turns off inverter 225. The logical value of node D is then provided by NMOS transistor N3. Effectively, NMOS transistor N3 also controls the signal on node D. For example, when the signal on node D is logically high, and NMOS transistor N3 is turned on, NMOS transistor N3 pulls the signal on node D to ground or a logical low value at the source of NMOS transistor N3.

Signal SLPb and signal SLP are complements of each other. For example, when signal SLPb is logically low, signal SLP is logically high, and vice versa. Further, when signal SLP is logically high and signal SLPb is logically low, inverter 230 is turned on, and inverts the signal on node C to provide the signal on node Cb. But when signal SLP is logically low and signal SLPb is logically high, inverter 230 is turned off. The signal on node Cb is provided by a voltage keeper circuit 233 or voltage keeper 233. In some embodiments, the logical value stored in voltage keeper 233 is the previous logical value of node Cb.

An inverter 235 and a PMOS transistor P2 form a latch. For example, when a signal on node B is logically high, the signal on node C is logically low and turns on PMOS transistor P2. As a result, the signal on node B continues to be logically high because the signal on node B is pulled to operational voltage VDD (not labeled) at the source of PMOS transistor P2. But when node C is logically high, transistor P2 is turned off, inverter 235 inverts a logical value on node B to provide an inversed logical value on node C.

A PMOS transistor P3 and an NMOS transistor N4 form an inverter inverting a signal on node A to the signal on node B. In some embodiments, when the signal on node A is logically high, but operational voltage VDD is low, the low voltage value of the logical high value on node A is not sufficient to turn on transistor N4.

An NMOS transistor N5 serves as a current path for NMOS transistor N4. For example, when transistor N5 is turned on, current IB flows through the source of transistor N5, which receives reference voltage VSS or ground, in some embodiments. But when transistor N5 is turned off, transistors N4 and N5 function as an open circuit.

An inverter 240 inverts signal SLPb to provide the signal on node A.

Figure 3A:
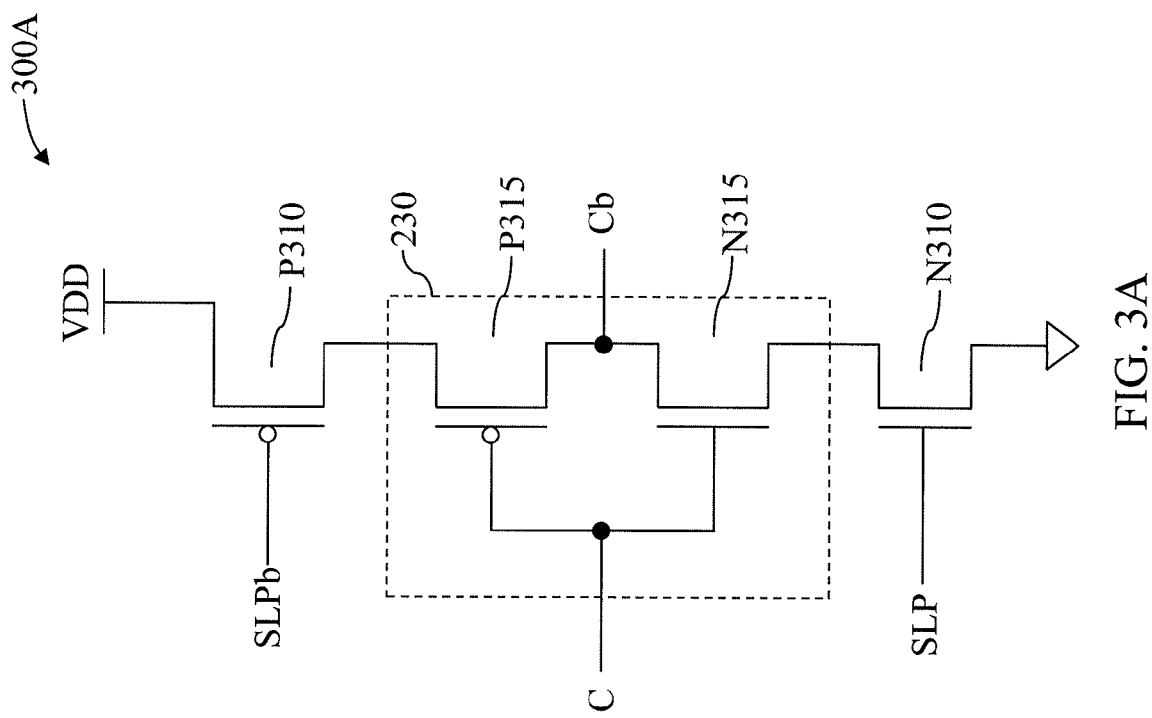
FIG. 3A is a diagram of a circuit illustrating an implementation of an inverter in FIG. 2B and corresponding circuits used to control the inverter, in accordance with some embodiments.

FIG. 3A is a diagram of a circuit 300A, in accordance with some embodiments. Circuit 300A is an implementation of inverter 230 in FIG. 2B and additional transistors configured to receive control signals SLPb and SLP.

A PMOS transistor P310 and an NMOS transistor N310 are used to turn on or turn off inverter 230 that includes a PMOS transistor P315 and an NMOS transistor N315, for PMOS transistor P315 and NMOS transistor N315 to perform the inverting function. For example, when signal SLPb is logically low and signal SLP is logically high transistors P310 and N310 are turned on. When the signal on node C is logically low, PMOS transistor P315 is turned on while NMOS transistor N315 is turned off. As a result, the signal on node Cb is pulled to voltage VDD or a logical high value at the source of PMOS transistor P310. In contrast, when the signal on node C is logically high, PMOS transistor P315 is turned off while NMOS transistor N315 is turned on. The signal on node Cb is therefore pulled to ground or a low logical value at the source of transistor N310. When signal SLPb is logically high and signal SLP is logically low, transistors P310 and N310 are turned off, and inverter 230 functions as an open circuit.

Figure 3B:
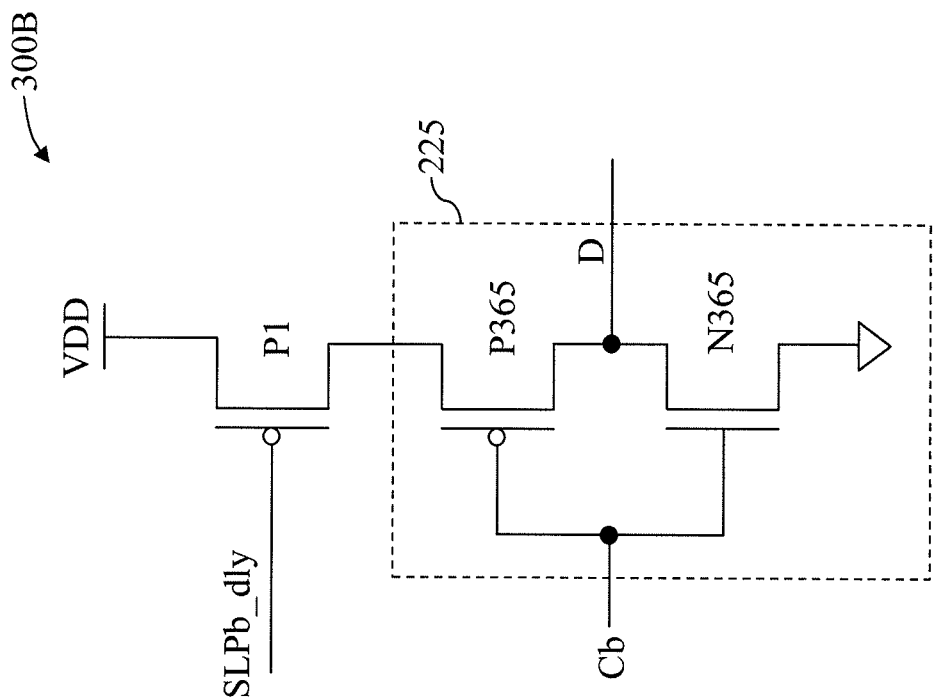
FIG. 3B is a diagram of a circuit illustrating an implementation of another inverter in FIG. 2B and a corresponding circuit used to control the inverter, in accordance with some embodiments.

FIG. 3B is a diagram of a circuit 300B, in accordance with some embodiments. Circuit 300B is an implementation of inverter 225 and PMOS transistor P1.

PMOS transistor P1 is used to turn on or turn off a PMOS transistor P365 and an NMOS transistor N365, for PMOS transistor P365 and NMOS transistor N365 to perform the inverting function. For example, when signal SLPb_dly is logically low, PMOS transistor P1 is turned on. When the signal on node Cb is logically low, PMOS transistor P365 is turned on while NMOS transistor N365 is turned off. As a result, the signal on node D is pulled to voltage VDD or a high logical value at the source of PMOS transistor P1. In contrast, when the signal on node Cb is logically high, PMOS transistor P365 is turned off while NMOS transistor N365 is turned on. As a result, the signal on node D is pulled to ground or a low logical value at the source of NMOS transistor N365. When signal SLPb_dly is logically high, however, PMOS transistor P1 is turned off, and inverter 225 functions as an open circuit.

Normal Read or Write Mode

FIG. 4 is a table 400 of operations of circuit 250, in accordance with some embodiments. In the below illustrations, unless otherwise stated, circuit 250 has been in the corresponding state longer than time delay T210. As a result, the logical value of signal SLPb_dly is the same as the logical value of signal SLPb.

With reference to line 410, circuit 250 operates in the normal read ("R") or write ("W") mode. Signal SLPb at the gate of NMOS transistors N1 is logically high. As a result, transistor N1 is turned on. Transistor N2 is also turned on as explained below. Both transistors N1 and N2 function as current paths for GIO 116. For example, current Iio flows through the drains and the sources of transistors N1 and N2 in circuit 250 in FIG. 2B.

Signal SLP is an inverse of signal SLPb, and is therefore logically low. Node F has a signal inversed from signal SLPb, and is therefore logical low. Node A has a signal inversed from signal SLPb through inverter 240, and is therefore logically low. Node B is logically high through the inverter formed by PMOS transistor P3 and NMOS transistor N4. Similarly, node C is logically low through invert 235.

Because signal SLPb is logically high and signal SLP is logically low, inverter 230 is turned off. As a result, node Cb is "x" indicating either a low or a high logical value because node Cb has a logical value stored in voltage keeper 233.

Signal SLPb_dly at the gates of NMOS transistor N3 and PMOS transistor P1 being logically high turns on NMOS transistor N3 and turns off PMOS transistor P1. As a result, the signal on node D is pulled to ground or a logical low value at the source of NMOS transistor N3. Because both signals on nodes D and F are logically low, the signal on node E is logically high. As a result, NMOS transistor N2 is turned on.

Sleep Mode with a Low Operational Voltage VDD

With reference to line 420, circuit 100 operates in a sleep mode when operational voltage VDD has a low voltage value of about 90% of typical operational voltage VDD value.

In this mode, signal SLPb at the gate of NMOS transistor N1 is logically low. As a result, transistor N1 is turned off. Transistor N2 is also turned off as explained below.

Signal SLP is an inverse of signal SLPb, and is therefore logically high.

Node F has a signal inversed from signal SLPb, and is therefore logically high. Because node F is logically high, by operation of NOR gate 215, the signal on node E is logically low regardless of the logical value of the signal on node D. As a result, NMOS transistor N2 is turned off.

Node A has a signal inversed from signal SLPb through inverter 240, and is therefore logically high.

Because operational voltage VDD has a low value of 90% of typical voltage VDD, the high logical value of node A is not sufficient to turn on transistor N4. As a result, transistors N4 and N5 are turned off, and have no electrical effect on node B. As a result, node B continues to have a high logical value from the previous state provided by PMOS transistor P2.

Node C is logically low through invert 235. Because signal SLPb is logically low and signal SLP is logically high, inverter 230 is turned on, and node Cb is logically high through inverter 230.

Signal SLPb_dly at the gates of NMOS transistor N3 and PMOS transistor P1 being logically low turns off transistor N3 and turns on PMOS transistor P1. Therefore, inverter 225 is turned on, and transistor N3 has no electrical effect on node D. As a result, the signal on node D is inverted from the signal on node Cb through inverter 225, and has a low logical value.

Because node F is logically high and node D is logically low, the signal on node E is logically low. As a result, NMOS transistor N2 is turned off.

Because signal SLPb is logically low and signal SLP is logically high, inverter 230 is on.

Sleep Mode with a High Operational Voltage VDD

With reference to line 430, circuit 250 operates in the sleep mode when operational voltage VDD has a high voltage value of about 110% of typical operational voltage VDD value.

In this mode, signal SLPb at the gate of NMOS transistors N1 is logically low. As a result, transistor N1 is turned off. Transistor N2 is also turned off as explained below.

Signal SLP is an inverse of signal SLPb, and is therefore logically high.

Node F has a signal inversed from signal SLPb, and is therefore logically high. Because node F is logically high, by operation of NOR gate 215, the signal on node E is logically low regardless of the logical value of the signal on node D. As a result, NMOS transistor N2 is turned off.

Node A has a signal inversed from signal SLPb through inverter 240, and is therefore logically high.

When operational voltage VDD has a high voltage value, NMOS transistors N4 and N5 are turned on. As a result, node B is pulled to ground or a low logical value at the source of transistor N5. Node C is logically high through inverter 235. Node Cb is logically low through inverter 230.

Signal SLPb_dly at the gate of NMOS transistor N3 being logically low turns off NMOS transistor N3 and turns on PMOS transistor P1. Transistor N3 therefore has no electrical effect on node D. Transistor P1 being turned on turns on inverter 225. As a result, the signal on node D is inverted from the signal on node Cb, and therefore has a high logical value.

Because node F is logically high, and node D is logically high, the signal on node E is logically low, which turns off transistor N2.

Because signal SLPb is logically low and signal SLP is logically high, inverter 230 is on.

Wake Up to the Normal Read or Write Mode when Operational Voltage Value is Low

With reference to line 440, circuit 250 transitions from a wake up mode to a normal read or write mode when operational voltage VDD is at a low voltage value, such as 90% of the typical operational voltage VDD value.

Signal SLPb at the gate of NMOS transistor N1 is logically high. As a result, transistor N1 is turned on. Transistor N2 is also turned on as explained below.

Signal SPLb_dly is signal SPLb delayed by delay time T210, and is also logically high. Signal SLP is an inverse of signal SLPb, and is logically low.

Node F has a signal inversed from signal SLPb, and is logically low.

Node A has a signal inversed from signal SLPb through inverter 240, and is logically low.

Because node A is logically low, transistor P3 is turned on, and node B is pulled to voltage VDD at the source of PMOS transistor P3 or a logical high value. Node C is therefore logically low by operation of inverter 235.

Because signal SLPb is logically high and signal SLP is logically low, inverter 230 is turned off. Node Cb, however, is logically high based on the data provided by voltage keeper 233.

Signal SLPb_dly at the gates of NMOS transistor N3 and PMOS transistor P1 being logically high turns on NMOS transistor N3 and turns off PMOS transistor P1. As a result, the signal on node D is pulled to ground or a low logical value at the source of transistor N3.

Because both signals on nodes D and F are logically low, the signal on node E is logically high, which turns on transistor N2.

Because signal SLPb is logically high and signal SLP is logically low, inverter 230 is off.

Wake Up to the Normal Read or Write Mode when Operational Voltage Value is High

With reference to line 450, circuit 250 transitions from the wake up mode to the normal read or write mode when operational voltage VDD is at a high voltage value such as 110% of the typical operational voltage VDD. In this example, both transistors N1 and N2 are initially turned off. Signal SLPb is provided but time period T210 has not completely elapsed.

Signal SLPb at the gate of NMOS transistor N1 is logically high. As a result, transistor N1 is turned on. Transistor N2, however, continues to be turned off as explained below.

Signal SLP is an inverse of signal SLPb, and is therefore logically low.

Node F has a signal inversed from signal SLPb, and is therefore logically low.

Node A has a signal inversed from signal SLPb through inverter 240, and is therefore logically low.

Because node A is logically low, PMOS transistor P3 is turned on, which pulls node B to voltage VDD or a high logical value at the source of transistor P3. Node C is logically low through inverter 235. As a result, PMOS transistor P2 is turned on and keeps node B at the high logical value by pulling node B to voltage VDD at the source of PMOS transistor P2.

Because signal SLPb is logically high and signal SPL is logically low, inverter 230 is turned off. Node Cb is provided by the data stored in voltage keeper 233, which is the previous logical value of node Cb.

Since time delay T210 has not completely passed, signal SLPb_dly at the gates of NMOS transistor N3 and PMOS transistor P1 continues to be logically low even though signal SLPb is logically high. As a result, NMOS transistor N3 is turned off and PMOS transistor P1 is turned on. The signal on node D is inverted from the signal on node Cb, and therefore is logically high.

Because the signal on node D is logically high and the signal on node F is logically low, the signal on node E is logically low. As a result, NMOS transistor N2 continues to be turned off.

Because signal SLPb is logically high and signal SLP is logically low, inverter 230 is off.

After time T210 has elapsed, circuit 250 is in the normal read or write mode. The data of corresponding signals and nodes is the same as that on line 410. For example, after time T210 has elapsed, signal SLPb_dly at the gates of NMOS transistor N3 and PMOS transistor P1 is logically high because signal SLPb is logically high. As a result, PMOS transistor P1 and inverter 225 are turned off. At the same time, NMOS transistor N3 is turned on, and pulls node D to ground or the low logical value at the source of transistor N3. Because both nodes D and F are logically low, node E is logically high, and NMOS transistor N2 is turned on.

In some existing approaches, one transistor is used to turn on or turn off GIO 116. The size of the transistor is large compared with the size of NMOS transistor N1 of the present disclosure. Various embodiments of the disclosure are advantageous because when circuit 250 is in the high operating voltage condition, NMOS transistor N1 is turned on, but NMOS transistor N2 is turned off. NMOS transistor N1 consumes a smaller amount of current and therefore results in a surge current smaller than that of some existing approaches.

Exemplary Circuits With Headers

Figure 5A:
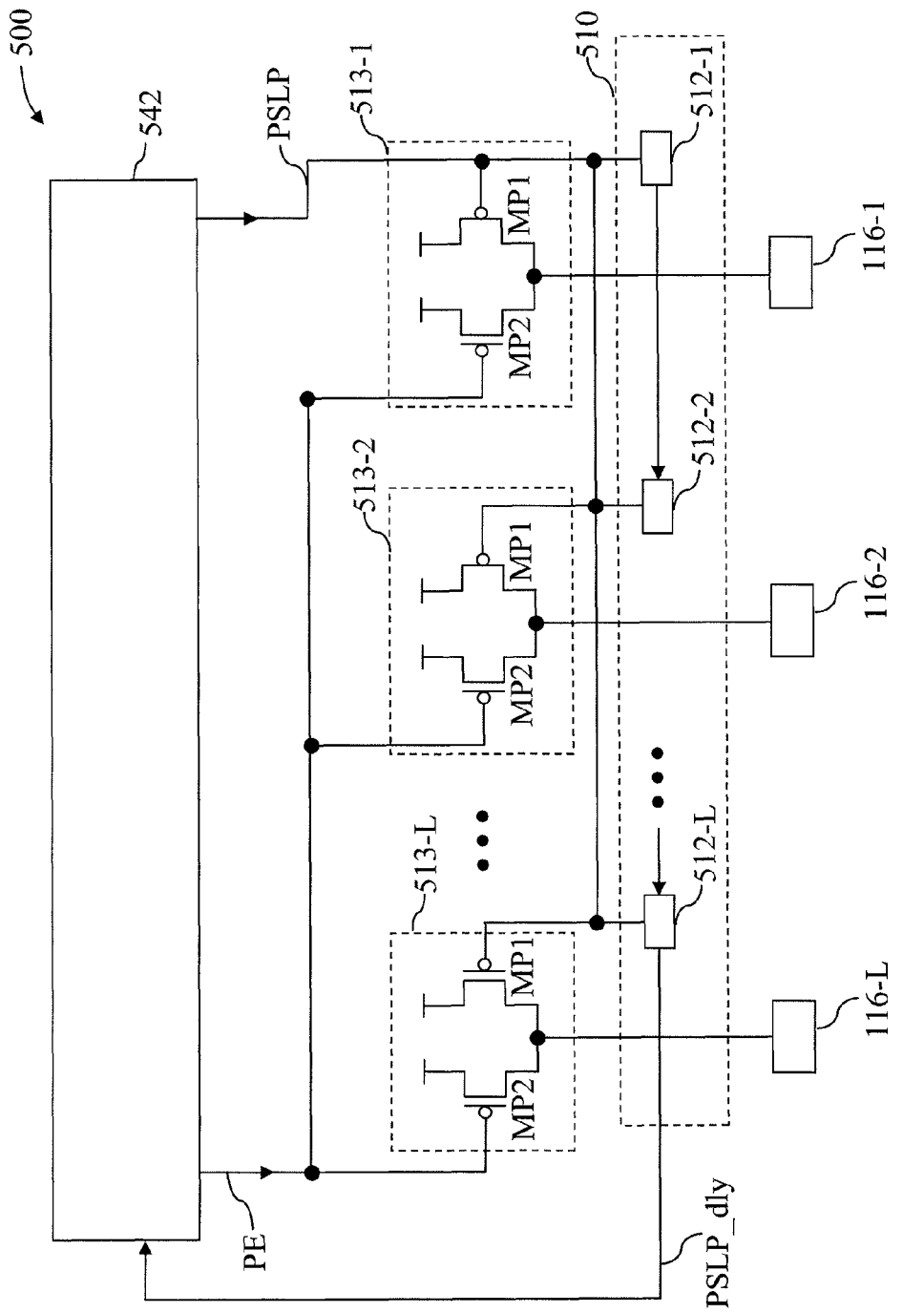
FIG. 5A is a diagram of a circuit illustrating connections of various circuits and corresponding header circuits of the memory macro in FIG. 1, in accordance with some embodiments.

FIG. 5A is a diagram of a circuit 500, in accordance with some embodiments. Circuit 500 is used to illustrate connection of GIOs 116 in FIG. 1 with corresponding header circuits 513.

Each header circuit or header 513-1 to 513-L corresponds to a GIO 116. For illustration, L number of GIOs 116 from GIO 116-1 to GIO 116-L are shown. Similarly, L number of corresponding headers 513-1 to 513L are shown. A header 513 serves as a current path for the corresponding GIO 116. Each header 513 includes a pair of PMOS transistors MP1 and MP2. In some embodiments, during the wake up time of memory macro 100 and thus GIOs 116, transistors MP1 and MP2 are turned on at different times or at the same time depending on the voltage value of operational voltage VDD. For example, when operational voltage value VDD is high, transistor MP1 is turned on first, and transistor MP2 is turned on after a predetermined time delay. In contrast, when operational voltage value VDD is low, both transistors MP1 and MP2 are turned on at about the same time. In some embodiments, headers 513 are called current circuits because headers 513 serve as current paths for GIOs 116. Headers 513 are also called switching circuits because NMOS transistors N1 and N2 in a header 513 are switched on or off to turn a corresponding GIO 116 on or off, respectively.

A delay circuit 510 receives a control signal PSLP from a control circuit 542 and generates a control signal PSLP_dly delayed from control signal PSLP by a time delay T510 (not labeled). In some embodiments, delay circuit 510 includes a plurality of delay elements 512-1 to 512-L. Each delay element 512 corresponds to a GIO 116 and a header 513. Control signals PSLP and PSLP_dly are used to turn on transistors MP1 and MP2 of header 513 at different times.

Control circuit 542 provides control signal PSLP to delay circuit 510 and to gates of PMOS transistors MP1 of header circuits 513. Control circuit 542 also receives control signal PSLP_dly, and, based on control signal PSLP_dly, generates a control signal on node PE that is received by gates of transistors MP2 of headers 513. Because the control signal on node PE controls PMOS transistors MP2, effectively, PMOS transistors MP2 of headers 513 are controlled by control signal PSLP_dly. In some embodiments, control circuit 542 is used with a row of GIOs 116 of memory macro 100. In other words, a row of GIOs 116 includes L number of GIOs 116 in both the left side and the right side of memory macro 100. GIOs 116 are used for illustration. In some embodiments, a decoder 112 is used in place of a GIO 116, and another control circuit similar to control circuit 542 is used with a column of decoders 112. In some embodiments, control circuit 542 is part of GCTRL 110 in FIG. 1.

Figure 5B:
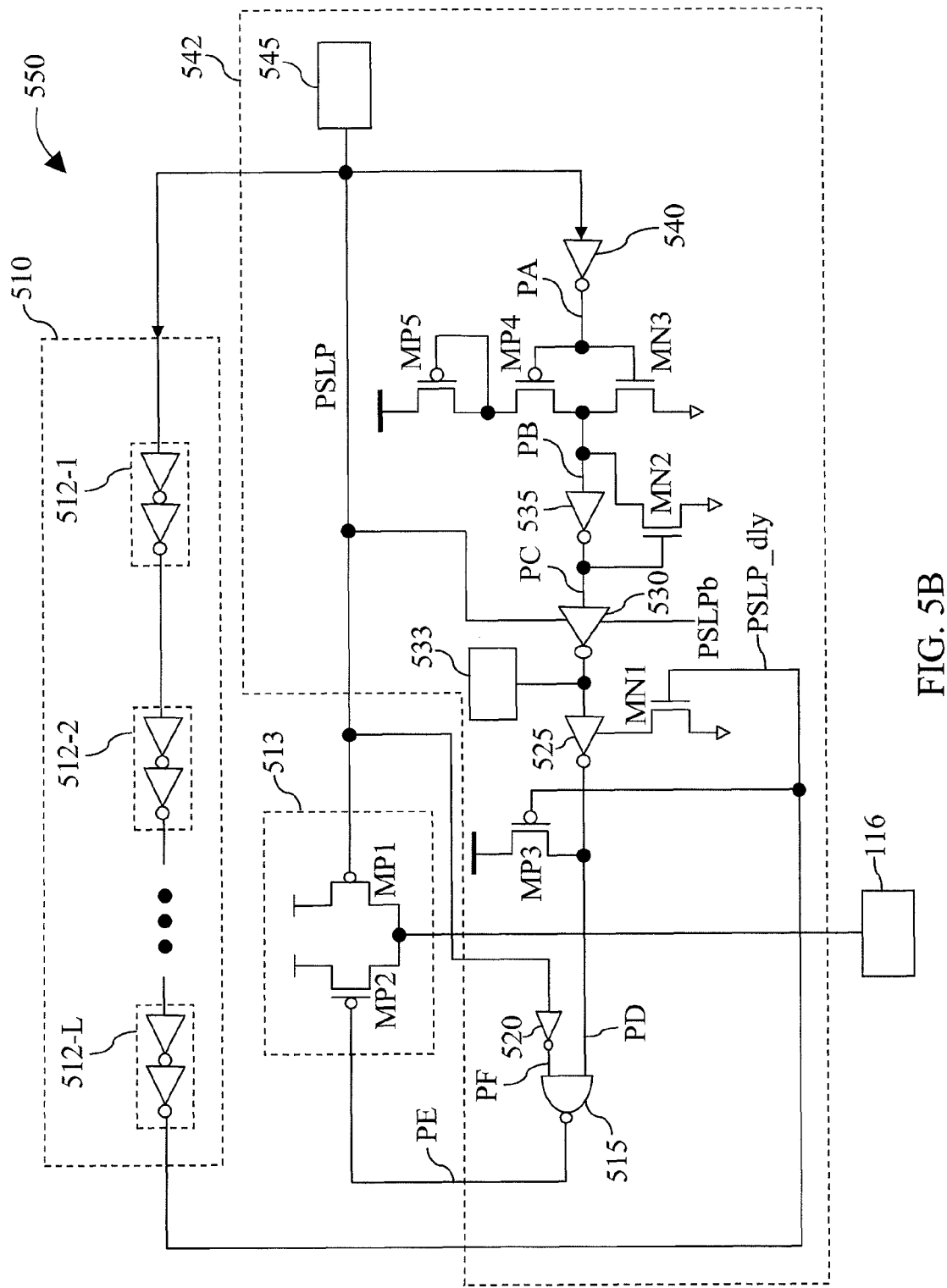
FIG. 5B is a diagram of a circuit illustrating connections of a global input-output circuit, a delay circuit, a header circuit, and a control circuit of the circuit in FIG. 5A, in accordance with some embodiments.

FIG. 5B is a diagram of a circuit 550, in accordance with some embodiments. Circuit 550 is used to illustrate an operation of GIO 116, header 513, delay circuit 510, and control circuit 542.

PMOS transistors MP1 and MP2 in header 513 serve as current paths for GIO 116. Effectively, transistors MP1 and MP2 turn on or turn off GIO 116. For example, when both transistors MP1 and MP2 are turned off, header 513 functions as an open circuit, and is electrically disconnected from GIO 116. But when both transistors MP1 and MP2 are completely turned on, both transistors MP1 and MP2 function as current paths for a current PIio to flow through the sources and the drains of transistors MP2 and MP1. In some embodiments, the sources of both transistors MP1 and MP2 receive operational voltage VDD. Effectively, current PIio flows from the node of operational voltage VDD through transistors MP1 and MP2 and GIO 116.

In some embodiments, when memory macro 100 is in the wake up mode, if operational voltage VDD is above a predetermined voltage value that is considered a high operating voltage condition, transistor MP1 is turned on first. Transistor MP2 is then turned on after a predetermined period of time T510, which will be explained below. But when the value for operating voltage value VDD is below the predetermined voltage value that is considered a low operating voltage condition, both transistors MP1 and MP2 are turned on at about the same time. In some embodiments, a high operating voltage value of operational voltage VDD is about 110% of nominal value of operating voltage VDD while a low value of operational voltage VDD is about 90% of the nominal value of operating voltage VDD, and the nominal value of operating voltage VDD is 0.9 V.

For illustration, current PIio in the high operating voltage value VDD is called PIioh (not labeled) while current PIio in the low operating voltage value is called current PIiol (not labeled). In some embodiments, transistors MP1 and MP2 are sized such that a current ratio PIrat (not labeled) is about ⅓. Mathematically, PIrat=PIiol/PIioh=⅓.

Delay circuit 510 generates time delay T510 that delays signal PSLP at the output of control circuit 542 or at the gate of transistor MP1. For example, signal PSLP_dly at gates of a PMOS transistor MP3 and an NMOS transistor MN1 is signal PSLP at the gate of transistor MP1 delayed by time delay T510. Signal PSLP_dly is then used to turn on and off PMOS transistor MP3 and NMOS transistor MN1, which determines a logical value of the signal on node PD. The signal on node PE is affected by the signal on node PD, and is used to turn on and off transistor MP2. Effectively, transistor MP2 is turned on and off based on control signal PSLP_dly. In some embodiments, time delay T510 is selected such that transistor MP2 of circuit 513 that is farthest from a sub-control circuit 545, is turned on after time delay T510. An example of the farthest circuit is circuit 513-L in FIG. 5A. As a result, in some embodiments, by the time time delay T510 has passed from the start of signal PSLP at the output of control circuit 545, transistors MP2 in a row are ready to be turned on, and generate a surge current in an acceptable range.

In some embodiments, a delay element 512 of delay circuit 510 includes a pair of inverters. In other words, an inverter pair 512 corresponds to GIO 116 in FIG. 5A. Circuit 510 is shown with a plurality of inverter pairs 512 is for illustration. Other circuits providing a time delay T510 are within the scope of various embodiments.

A logic circuit in the form of a NAND gate 515 provides a signal at the output of NAND gate 515 at node PE or at the gate of transistor MP2 to turn on or off transistor MP2. For example, when both signals on nodes PD and PF at the inputs of NAND gate 215 are logically high, a signal on node PE is logically low, which turns on PMOS transistor MP2.

An inverter 520 inverts signal PSLP to generate a signal on node PF at an input of NAND gate 515.

Gates of NMOS transistor MN1 and PMOS transistor MP3 are coupled together and are configured to receive signal PSLP_dly. When signal PSLP_dly is logically high, NMOS transistor MN1 is turned on while PMOS transistor MP3 is turned off. But when signal PSLP_dly is logically low, NMOS transistor MN1 is turned off while PMOS transistor MP3 is turned on. NMOS transistor MN1 is used to control inverter 525. For example, when signal PSLP_dly at a gate of transistor MN1 is logically high, transistor MN1 is turned on, which, in turn, turns on inverter 525. In such a situation, the signal on node PD is an inverse of a signal on node PCb at the input of inverter 525. Effectively, transistor MN1 controls the signal on node PD. In contrast, when signal PSLP_dly is logically low, transistor MN1 is turned off, which also turns off inverter 525. The logical value of node PD is then provided by PMOS transistor MP3. Effectively, PMOS transistor MP3 also controls the signal on node PD. For example, when the signal on node PD is logically high, and PMOS transistor MP3 is turned on, PMOS transistor MP3 pulls the signal on node PD to operational voltage VDD or a logical high value at the source of PMOS transistor MP3.

Signal SLPb and signal SLP are complements of each other. For example, when signal SLPb is logically low, signal SLP is logically high, and vice versa. Further, when signal SLP is logically high and signal SLPb is logically low, inverter 530 is turned on, and inverts a signal on node PC to provide the signal on node PCb. But when signal SLP is logically low and signal SLPb is logically high, inverter 530 is turned off. The signal on node PCb is provided by a voltage keeper circuit 533 or voltage keeper 533. In some embodiments, the logical value stored in voltage keeper 533 is a previous logical value of node PCb.

An inverter 535 and an NMOS transistor MN2 form a latch. For example, when a signal on node PB is logically low, the signal on node PC is logically high and turns on NMOS transistor MN2. As a result, the signal on node PB continues to be logically low because the signal on node PB is pulled to reference voltage VSS (not labeled) at the source of NMOS transistor MN2. But when node PC is logically low, transistor MN2 is turned off, inverter 535 inverts the logical value on node PB to provide an inversed signal on node PC.

An NMOS transistor MN3 and a PMOS transistor MP4 form an inverter inverting a signal on node PA to the signal on node PB. In some embodiments, when the signal on node PA is logically low, but operational voltage VDD is high, the high voltage value of the logical low value on node PA is not sufficient to turn on PMOS transistor MP4.

A PMOS transistor MP5 serves as a current path for PMOS transistor MP4. For example, when transistor MP5 is turned on, current PIB flows from the source of transistor MP5, which receives operational voltage VDD. But when transistor MP5 is turned off, transistors MP4 and MP5 function as an open circuit.

An inverter 540 inverts signal PSLP to provide the signal on node PA.

Figure 6A:
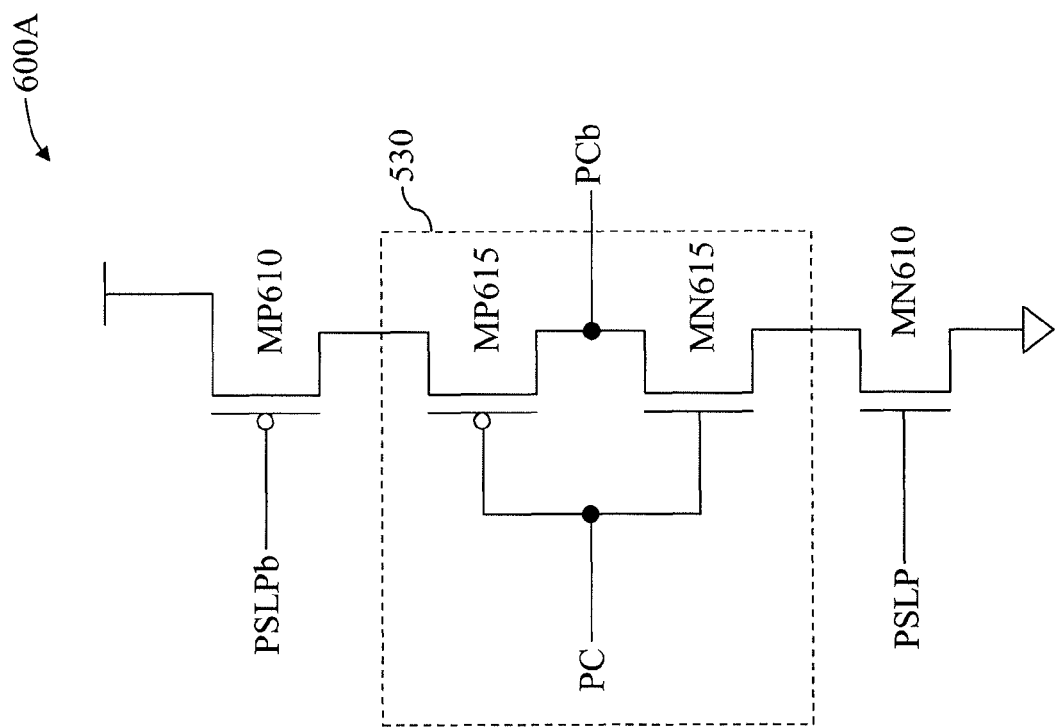
FIG. 6A is a diagram of a circuit illustrating an implementation of an inverter in FIG. 5B and corresponding circuits used to control the inverter, in accordance with some embodiments.

FIG. 6A is a diagram of a circuit 600A, in accordance with some embodiments. Circuit 600A is an implementation of inverter 530 and additional transistors configured to receive control signals PSLPb and PSLP.

An NMOS transistor MN610 and a PMOS transistor MP610 are used to turn on or turn off inverter 530 that includes a PMOS transistor MP615 and an NMOS transistor MN615, for PMOS transistor MP615 and NMOS transistor MN615 to perform the inverting function. For example, when signal PSLPb is logically low and signal PSLP is logically high transistors MP610 and MN610 are turned on. When the signal on node PC is logically low, PMOS transistor MP615 is turned on while NMOS transistor MN615 is turned off. As a result, the signal on node PCb is pulled to voltage VDD or a logical high value at the source of PMOS transistor MP610. In contrast, when the signal on node PC is logically high, PMOS transistor MP615 is turned off while NMOS transistor MN615 is turned on. The signal on node PCb is therefore pulled to ground or a low logical value at the source of transistor MN610. When signal SLPb is logically high and signal SLP is logically low, transistors MP610 and MN610 are turned off, and inverter 530 functions as an open circuit.

Figure 6B:
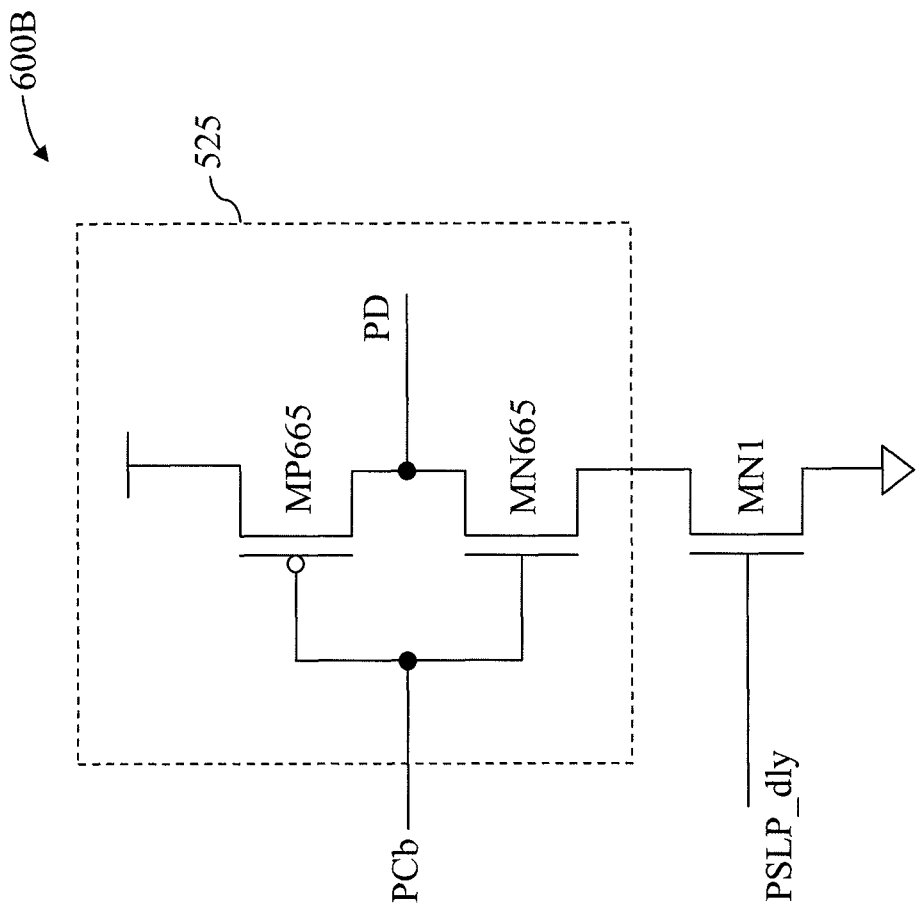
FIG. 6B is a diagram of a circuit illustrating an implementation of another inverter in FIG. 5B and a corresponding circuit used to control the inverter, in accordance with some embodiments.

FIG. 6B is a diagram of a circuit 600B, in accordance with some embodiments. Circuit 600B is an implementation of inverter 525 and NMOS transistor MN1.

NMOS transistor MN1 is used to turn on or turn off a PMOS transistor MP665 and an NMOS transistor MN665 for PMOS transistor MP665 and NMOS transistor MN665 to perform the inverting function. For example, when signal PSLP_dly is logically high, transistor MN1 is turned on. When the signal on node PCb is logically high, PMOS transistor MP665 is turned off while NMOS transistor MN665 is turned on. As a result, the signal on node PD is pulled to voltage VSS or ground or a low logical value at the source of NMOS transistor MN1. In contrast, when the signal on node PCb is logically low, PMOS transistor MP665 is turned on while NMOS transistor MN665 is turned off. As a result, the signal on node PD is pulled to operational voltage VDD or a high logical value at the source of PMOS transistor MP665. When signal PSLP_dly is logically low, however, NMOS transistor MN1 is turned off, and inverter 525 functions as an open circuit.

Normal Read or Write Mode

FIG. 7 is a table 700 illustrating operations of circuit 550, in accordance with some embodiments. In the below illustrations, unless otherwise stated, circuit 550 has been in the corresponding state longer than time delay T510. As a result, the logical value of signal PSLP_dly is the same as that of signal PSLP.

With reference to line 710, circuit 550 operates in the normal read ("R") or write ("W") mode. Signal PSLP at the gate of PMOS transistors MP1 is logically low. As a result, transistor MP1 is turned on. Transistor MP2 is also turned on as explained below. Both transistors MP1 and MP2 function as current paths for GIO 116. For example, current PIio flows through the sources and the drains of transistors MP1 and MP2 and GIO 116 in circuit 550 in FIG. 5B.

Signal PSLPb is an inverse of signal PSLP, and is therefore logically high. Node PF has a signal inversed from signal PSLP, and is therefore logical high. Node PA has a signal inversed from signal PSLP through inverter 540, and is therefore logically high. Node PB is logically low through the inverter formed by NMOS transistor MN3 and PMOS transistor MP4. Similarly, node PC is logically high through invert 535.

Because signal PSLP is logically low and signal PSLPb is logically high, inverter 530 is turned off. As a result, node PCb is "x" indicating either a low or a high logical value because node PCb has a logical value stored in voltage keeper 533.

Signal PSLP_dly at the gates of PMOS transistor MP3 and NMOS transistor MN1 being logically low turns on PMOS transistor MP3 and turns off NMOS transistor MN1. As a result, the signal on node PD is pulled to operational voltage VDD or a high logical value at the source of PMOS transistor MP3. Because both signals on nodes PD and PF are logically high, the signal on node PE is logically low. As a result, PMOS transistor MP2 is turned on.

Sleep Mode with a Low Operational Voltage VDD

With reference to line 720, circuit 550 operates in the sleep mode when operational voltage VDD has a low voltage value of about 90% of typical operational voltage VDD value.

In this mode, signal PSLP at the gate of PMOS transistors MP1 is logically high. As a result, transistor MP1 is turned off. Transistor MP2 is also turned off as explain below.

Signal PSLPb is an inverse of signal PSLP, and is therefore logically low.

Node PF has a signal inversed from signal PSLP, and is therefore logically low. Because node PF is logically low, by operation of NAND gate 515, the signal on node PE is logically high regardless of the logical value of the signal on node PD. As a result, PMOS transistor MP2 is turned off.

Node PA has a signal inversed from signal PSLP through inverter 540, and is therefore logically low.

When operational voltage VDD has a low voltage value, PMOS transistors MP4 and MP5 are turned on. As a result, node PB is pulled to operational voltage VDD or a high logical value at the source of PMOS transistor MP5. Node PC is logically high through inverter 535. Node PCb is logically low through inverter 530.

Signal PSLP_dly at the gate of PMOS transistor MP3 being logically high turns off PMOS transistor MP3 and turns on NMOS transistor MN1. Transistor MP3 therefore has no electrical effect on node PD. Transistor MN1 being turned on turns on inverter 525. As a result, the signal on node PD is inverted from the signal on node PCb, and therefore has a high logical value.

Because node PF is logically low, and node D is logically high, the signal on node PE is logically high, which turns off transistor MP2.

Because signal PSLP is logically high and signal PSLPb is logically low, inverter 530 is on.

Sleep Mode with a High Operational Voltage VDD

With reference to line 730, circuit 550 operates in the sleep mode when operational voltage VDD has a high voltage value of about 110% of typical operational voltage VDD value.

In this mode, signal PSLP at the gate of PMOS transistor MP1 is logically high. As a result, transistor MP1 is turned off. Transistor MP2 is also turned off as explained below.

Signal PSLPb is an inverse of signal PSLP, and is therefore logically low.

Node PF has a signal inversed from signal PSLP, and is therefore logically low. Because node PF is logically low, by operation of NAND gate 515, the signal on node PE is logically high regardless of the logical value of the signal on node PD. As a result, PMOS transistor MP2 is turned off.

Node PA has a signal inversed from signal PSLP through inverter 540, and is therefore logically low.

Because operational voltage VDD has a high value of 110% of typical voltage VDD, the low logical value of node PA is too high and is not sufficiently low to turn on PMOS transistor MP4. As a result, PMOS transistors MP4 and MP5 are turned off, and have no electrical effect on node PB. As a result, node PB continues to have a high logical value from the previous state provided by PMOS transistor MP2.

Node PC is logically low through inverter 535. Because signal PSLP is logically high and signal PSLPb is logically low, inverter 530 is turned on, and node PCb is logically high through inverter 530.

Signal PSLP_dly at the gates of PMOS transistor MP3 and NMOS transistor MN1 being logically high turns off PMOS transistor MP3 and turns on NMOS transistor MN1. Therefore, inverter 525 is turned on, and transistor MP3 has no electrical effect on node PD. As a result, the signal on node PD is inverted from the signal on node PCb through inverter 525, and has a low logical value.

Because node PF is logically high and node PD is logically low, the signal on node E is logically high. As a result, PMOS transistor MP2 is turned off.

Because signal PSLP is logically high and signal PSLPb is logically low, inverter 530 is on.

Wake Up to the Normal Read or Write Mode when Operational Voltage Value is Low

With reference to line 740, circuit 550 transitions from a wake up mode to a normal read or write mode when operational voltage VDD is at a low voltage value, such as 90% of the typical operational voltage VDD value.

Signal PSLP at the gate of PMOS transistor MP1 is logically low. As a result, transistor MP1 is turned on. Transistor MP2 is also turned on as explained below.

Signal PSPL_dly is signal PSPL delayed by delay time T510, and is also logically low. Signal PSLPb is an inverse of signal PSLP, and is logically high.

Node PF has a signal inversed from signal PSLP, and is logically high.

Node PA has a signal inversed from signal PSLP through inverter 540, and is logically high.

Because node PA is logically high, transistor MN3 is turned on, and node PB is pulled to reference voltage VSS or ground at the source of NMOS transistor MN3 or a logical low value. Node PC is therefore logically high by operation of inverter 535.

Because signal PSLP is logically low and signal PSLPb is logically high, inverter 530 is turned off. Node PCb, however, is logically low based on the data provided by voltage keeper 533.

Signal PSLP_dly at the gates of PMOS transistor MP3 and NMOS transistor MN1 being logically low turns on PMOS transistor MP3 and turns off NMOS transistor MN1. As a result, the signal on node PD is pulled to operational voltage VDD or a high logical value at the source of transistor MP3.

Because both signals on nodes D and F are logically high, the signal on node E is logically low, which turns on PMOS transistor MP2.

Because signal PSLP is logically low and signal PSLPb is logically high, inverter 530 is off.

Wake Up to the Normal Read or Write Mode when Operational Voltage Value is High

With reference to line 750, circuit 550 transitions from the wake up mode to the normal read or write mode when operational voltage VDD is at a high voltage value such as 110% of the typical operational voltage VDD. In this example, both transistors MP1 and MP2 are initially turned off. Signal PSLP is provided but time period T510 has not completely elapsed.

Signal PSLP at the gate of PMOS transistor MP1 is logically low. As a result, transistor MP1 is turned on. Transistor MP2, however, continues to be turned off as explained below.

Signal PSLPb is an inverse of signal PSLP, and is therefore logically high.

Node PF has a signal inversed from signal PSLP, and is therefore logically high.

Node PA has a signal inversed from signal PSLP through inverter 540, and is therefore logically high.

Because node PA is logically high, NMOS transistor MN3 is turned on, which pulls node PB to reference voltage VSS or a low logical value at the source of transistor MN3. Node PC is logically high through inverter 535. As a result, NMOS transistor MN2 is turned on and keeps node PB at the low logical value by pulling node PB to voltage VSS at the source of NMOS transistor MN2.

Because signal PSLP is logically low and signal PSPLb is logically high, inverter 530 is turned off. Node PCb is provided by the data stored in voltage keeper 533, which is a previous logical value of node PCb.

Since time delay T510 has not completely passed, signal PSLP_dly at the gates of PMOS transistor MP3 and NMOS transistor MN1 continues to be logically high even though signal PSLP is logically low. As a result, PMOS transistor MP3 is turned off and NMOS transistor MN1 is turned on. The signal on node PD is inverted from the signal on node PCb, and therefore is logically low.

Because the signal on node PD is logically low and the signal on node PF is logically high, the signal on node PE is logically high. As a result, PMOS transistor MP2 continues to be turned off.

Because signal PSLP is logically low and signal PSLPb is logically high, inverter 530 is off.

After time T510 has completely elapsed, circuit 550 is in the normal read or write mode. The data of corresponding signals and nodes is as the same as the data on line 710. For example, after time T510 has elapsed, signal PSLP_dly at the gates of PMOS transistor MP3 and NMOS transistor MN1 is logically low because signal PSLP is logically low. As a result, NMOS transistor MN1 and inverter 525 are turned off. At the same time, PMOS transistor MP3 is turned on, and pulls node PD to operational voltage VDD or a high logical value at the source of PMOS transistor MP3. Because both nodes PD and PF are logically high, node PE is logically low, and transistor MP2 is turned on.

In some existing approaches, one transistor is used to turn on or turn off GIO 116. The size of the transistor is large compared with the size of transistor MP1 of the present disclosure. Various embodiments of the disclosure are advantageous because when circuit 550 is in the high operating voltage condition, transistor MP1 is turned on, but transistor MP2 is turned off. Transistor MP1 consumes a smaller amount of current and therefore results in a surge current smaller than that of some existing approaches.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular level when a signal is activated and/or deactivated. Selecting different levels is within the scope of various embodiments. In various embodiments, a transistor functions as a switch. A switching circuit used in place of a transistor is within the scope of various embodiments.

In some embodiments, a first transistor is turned on based on a first control signal provided to a first terminal of the first transistor. A second transistor is turned on based on a second control signal delayed by a time delay from the first control signal. A second terminal of the first transistor is coupled with a second terminal of the second transistor. The second control signal is used to control a first input signal of a logic device. The logic device receives a second input signal inversed from the first control signal. An output signal of the logic device is used to control a first terminal of the second transistor.

In some embodiments, a circuit comprises a first transistor, a second transistor, a delay circuit, and a logic device. A first terminal of the first transistor is configured to receive a first control signal. A second terminal of the first transistor is coupled with a second terminal of the second transistor. A first terminal of the second transistor is coupled with an output of the logic device. A first input of the logic device is configured to receive a first input signal controlled by a second control signal delayed from the first control signal by a time delay provided by the delay circuit. A second input of the logic device is configured to receive a second input signal inversed from the first control signal.

In some embodiment, a circuit comprises a plurality of current circuits, a control circuit, a plurality of sub-circuits, a delay circuit Each current circuit of the plurality of current circuits is configured to receive a first control signal provided by the control circuit, and is configured as a current path for a corresponding sub-circuit of the plurality of sub-circuits. The delay circuit is configured to provide a second control signal delayed from the first control signal by a time delay. The control circuit is configured to generate a third control signal based on the second control signal. The third control signal is used to control the plurality of current circuits.

The above examples include exemplary steps, but the steps are not necessarily performed in the order shown. Steps may be added, replaced, changed order, and/or eliminated as appropriate, in accordance with the spirit and scope of disclosed embodiments.

What is claimed is:

1. A method comprising:
    turning on a first transistor based on a first control signal provided to a first terminal of the first transistor; and
    turning on a second transistor based on a second control signal provided to a first terminal of the second transistor, the second control signal delayed by a time delay from the first control signal,
    wherein
        a second terminal of the first transistor is coupled with a second terminal of the second transistor;
        the second control signal is used to control a first input signal of a logic device;
        the logic device receives a second input signal inversed from the first control signal; and
        an output signal of the logic device is used to control the first terminal of the second transistor.

2. The method of claim 1, wherein
    the first transistor together with the second transistor corresponds to a global input-output circuit or to a decoder circuit of a memory macro.

3. The method of claim 1, wherein
the second terminal of the first transistor coupled with the second terminal of the second transistor is coupled with a global input-output circuit or a decoder circuit of a memory macro.

4. The method of claim 1, wherein
the logic device is a NOR gate or a NAND gate;
the second control signal is received by a first terminal of a third transistor and a first terminal of a fourth transistor;
a dopant of the third transistor is different from a dopant of the fourth transistor;
the fourth transistor is configured to control an inverter; and
the inverter provides the first input signal.

5. A circuit comprising:
a first transistor;
a second transistor;
a delay circuit; and
a logic device,
wherein
 a first terminal of the first transistor is configured to receive a first control signal;
 a first terminal of the second transistor is coupled with an output of the logic device;
 a second terminal of the first transistor is coupled with a second terminal of the second transistor;
 a first input of the logic device is configured to receive a first input signal controlled by a second control signal delayed from the first control signal by a time delay provided by the delay circuit; and
 a second input of the logic device is configured to receive a second input signal inversed from the first control signal.

6. The circuit of claim 5 further comprising:
a third transistor; and
a fourth transistor,
wherein
 a first terminal of the third transistor is coupled with a first terminal of the fourth transistor and is configured to receive the second control signal;
 the third transistor is configured to generate a first logical value of the first input; and
 the fourth transistor is configured to generate a second logical value of the first input.

7. The circuit of claim 6, further comprising:
a first inverter coupled with the third transistor and the fourth transistor; and
a keeper circuit,
wherein
 the fourth transistor is configured to control the first inverter to generate the second logical value of the first input;
 the third transistor is configured to generate the first logical value of the first input at an output of the first inverter; and
 the keeper circuit is configured to provide a first inverter input at an input of the first inverter.

8. The circuit of claim 7, further comprising:
a second inverter;
a third inverter; and
a fifth transistor,
wherein
 the second inverter is configured to be controlled by the first control signal and an inversed signal of the first control signal;
 an output of the second inverter is coupled with the input of the first inverter; and
 the fifth transistor is coupled between an input and an output of the third inverter, and, together with the third inverter, is configured as a latch.

9. The circuit of claim 8, further comprising:
a sixth transistor;
a seventh transistor;
an eight transistor; and
a fourth inverter,
wherein
 the sixth transistor and the seventh transistor are configured as an inverter;
 the eighth transistor is configured as a current path for the sixth transistor and the seventh transistor;
 an output of the fourth inverter is coupled with an input of the inverter configured from the sixth transistor and the seventh transistor; and
 an input of the fourth inverter is configured to receive the first control signal.

10. The circuit of claim 5, wherein
the delay circuit includes a plurality of inverters configured to generate the time delay.

11. The circuit of claim 5, wherein
the delay circuit includes a plurality of delay elements; and
each delay element of the plurality of delay elements corresponds to an input-output circuit or a decoder circuit of a memory macro.

12. A circuit comprising:
a plurality of current circuits;
a control circuit;
a plurality of sub-circuits; and
a delay circuit,
wherein
 each current circuit of the plurality of current circuits is configured to receive a first control signal provided by the control circuit and is configured as a current path for a corresponding sub-circuit of the plurality of sub-circuits;
 the delay circuit is configured to provide a second control signal delayed from the first control signal by a time delay;
 the control circuit is configured to generate a third control signal based on the second control signal; and
 the third control signal is used to control the plurality of current circuits.

13. The circuit of claim 12, wherein
a sub-circuit of the plurality of sub-circuits includes an input-output or a decoder circuit of a memory macro.

14. The circuit of claim 12, wherein
the delay circuit comprises a plurality of delay elements; and
each delay element of the plurality of delay elements corresponds to a sub-circuit of the plurality of sub-circuits.

15. The circuit of claim 12, wherein
each current circuit of the plurality of current circuits comprises a first transistor and a second transistor;
a first terminal of the first transistor of the each current circuit is configured to receive the first control signal;
a first terminal of the second transistor of the each current circuit is configured to receive the third control signal; and
a second terminal of the first transistor of the each current circuit is coupled with a second terminal of the second transistor of the each current circuit and with a corresponding sub-circuit of the plurality of sub circuits.

16. The circuit of claim 12, wherein
each current circuit of the plurality of current circuits comprises a first transistor and a second transistor; and the first transistor of the each current circuit is configured to turn on before the second transistor of the each current circuit based on the time delay.

17. The circuit of claim 16, wherein
the first transistor of the each current circuit is configured to turn on before the second transistor of the each current circuit further based on an operating voltage of the plurality of sub-circuits.

18. The circuit of claim 12, wherein
each current circuit of the plurality of current circuits comprises a first transistor and a second transistor;
the first transistor of the each current circuit is configured to turn on before the second transistor of the each current circuit at a first operational voltage value of the plurality of sub-circuits;
the first transistor and the second transistor of the each current circuit are configured to turn on at about a same time at a second operational voltage value of the plurality of sub-circuits; and
the first operational voltage value is higher than the second operational voltage value.

19. The circuit of claim 12, wherein
the control circuit comprises a logic device, a first inverter, a first transistor, and a second transistor;
an output of the logic device is configured to provide the third control signal;
an output of the first inverter is configured to provide a first input signal to a first input of the logic device;
the first transistor is configured to control the first inverter;
the second transistor is configured to generate a first logical value of the first input signal; and
a second input of the logic device is configured to receive a second input signal inversed from the first control signal.

20. The circuit of claim 19, wherein
the control circuit further comprises a voltage keeper and a second inverter;
an output of the second inverter is configured to provide an input signal of the first inverter; and
the voltage keeper is coupled with the output of the second inverter.

* * * * *